United States Patent [19]

Kleinberg

[11] Patent Number: 4,644,306
[45] Date of Patent: Feb. 17, 1987

[54] PROGRAMMABLE ELECTRONIC SYNTHESIZED CAPACITANCE

[75] Inventor: Leonard L. Kleinberg, Greenbelt, Md.

[73] Assignee: The United States of America as represented by the Administrator of the National Aeonautics and Space Administration, Washington, D.C.

[21] Appl. No.: 754,707

[22] Filed: Jul. 15, 1985

[51] Int. Cl.⁴ .................. H03H 11/48; H03H 11/52
[52] U.S. Cl. ........................... 333/214; 307/490; 330/107; 330/294; 331/177 R; 333/217
[58] Field of Search ............ 333/213, 214, 217; 307/490, 494; 330/107, 294; 331/177 R

[56] References Cited

U.S. PATENT DOCUMENTS

| | | | |
|---|---|---|---|
| 3,553,609 | 1/1971 | Edge | 333/214 |
| 3,713,033 | 1/1973 | Frerking . | |
| 3,737,805 | 6/1973 | Shimodaira et al. . | |
| 3,754,152 | 8/1973 | Koehler et al. . | |
| 3,909,748 | 9/1975 | Yuan et al. . | |
| 4,001,735 | 1/1977 | Cheng et al. | 333/213 |
| 4,016,508 | 4/1977 | Kobori . | |
| 4,025,867 | 5/1977 | Seidel | 333/214 X |
| 4,179,671 | 12/1979 | Yoshida et al. . | |
| 4,383,230 | 5/1983 | Manzolini | 333/214 |
| 4,516,041 | 5/1985 | Quan | 307/494 |

*Primary Examiner*—Paul Gensler
*Attorney, Agent, or Firm*—John O. Tresansky; John R. Manning; Ronald F. Sandler

[57] ABSTRACT

A predetermined and variable synthesized capacitance which may be incorporated into the resonant portion of an electronic oscillator for the purpose of tuning the oscillator comprises a programmable operational amplifier circuit. The operational amplifier circuit has its output connected to its inverting input, in a "follower" configuration, by a network which is low impedance at the operational frequency of the circuit. The output of the operational amplifier is also connected to the non-inverting input by a capacitor. The non-inverting input appears as a synthesized capacitance which may be varied with a variation in gain-bandwidth product of the operational amplifier circuit. The gain-bandwidth product may, in turn, be varied with a variation in input set current with a digital to analog converter whose output is varied with a command word. The output impedance of the circuit may also be varied by varying the output set current. This circuit may provide very small changes in oscillator frequency with relatively large control voltages unaffected by noise.

19 Claims, 1 Drawing Figure

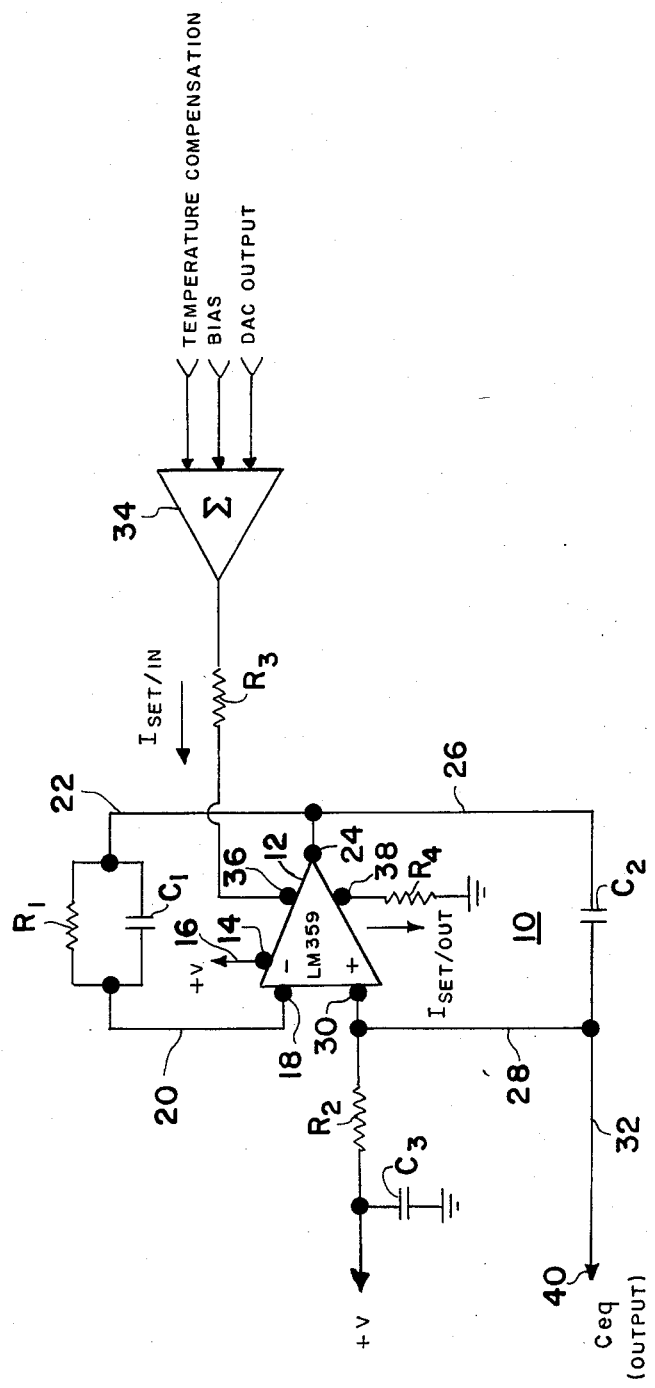

PROGRAMMABLE ELECTRONIC SYNTHESIZED CAPACITANCE

ORIGIN OF THE INVENTION

The invention described herein was made by an employee of the United States Government, and may be manufactured and used by or for the Government for governmental purposes without the payment of any royalties thereon or therefor.

TECHNICAL FIELD

This invention pertains to amplifiers and, more particularly, to an amplifier which functions as a variable electronic capacitance.

BACKGROUND ART

Numerous oscillator circuits have been designed with the capability of providing controlled output frequency variation within a given range. To produce these frequency variations obviously requires some variation of circuit parameters and usually involves some variation in circuit capacitance. The prior art includes a system for digitally correcting an oscillator frequency by first converting the digital information to an analog voltage which is applied to a varactor diode. Any changes in digital code changes the analog voltage and varies the varactor capacitance which, in turn, changes the oscillator frequency. In this type of system, it is difficult to achieve a very small change in capacitance in the varactor capacitance to achieve a very small deviation in oscillator frequency without complex circuitry because very small voltage changes are required to produce these small variations in capacitance and these small variations in voltages are in the noise level of the diode. Further, the changes in capacitance are non-linear with respect to variations in applied voltages. Other systems involve digitally or manually switching in various combinations of capacitors that are made available in the form of a bank of capacitors. For the digitally switched systems that include a bank of capacitors, very small changes in capacitance are difficult to achieve because of the physical limitations related to the capacitors that may be employed. The smallest lumped constant capacitor is typically in the order of 0.1 pf. Tolerance, physical size, and cost may present substantial problems depending on the required system parameters. Further, each capacitor in the bank must be physically connected into the system by different leads, each having a different stray capacitance which changes with environment. In addition to the problems associated with the digitally switched systems, the mechanically switched systems have failure problems traditionally associated with switches, especially those which are miniature. Thus, the prior art is only capable of easily achieving predictable and stable variations in capacitance which are relatively large in order to produce, for instance, relatively large changes in oscillator frequency.

STATEMENT OF THE INVENTION

Accordingly, it is an object of this invention to provide an electronically synthesized capacitance.

It is another object of the invention to provide an electronically synthesized capacitance which may be varied in small increments.

It is yet another object of the invention to provide an electronically synthesized capacitance which is small and stable.

It is still another object of the invention to provide an electronically synthesized capacitance which may be varied by relatively large control voltages.

It is still a further object of the invention to provide an electronically synthesized capacitance which is useful for controlling oscillator frequency.

Briefly, these and other objects are achieved in a programmable Norton type amplifier whose input set current can be controlled by a digital signal applied to a digital to analog converter, the variation in input set current changing the amplifier gain-bandwidth and, in turn changing the capacitance appearing at the non-inverting input of the amplifier.

BRIEF DESCRIPTION OF THE DRAWING

The sole FIGURE is a schematic representation of the electronically synthesized capacitance of this invention.

DETAILED DESCRIPTION OF THE INVENTION

The electronically synthesized and variable capacitance provided by programmable amplifier circuit 10 is shown in the FIGURE as including a single operational amplifier chip 12, which may be an LM359 Norton type, current differencing, amplifier chip. The Norton amplifier is chosen for this embodiment because of its comparatively high frequency characteristic. Any programmable operational amplifier, such as an OP-32, will also function according to the invention. The programmability refers to the capability to vary power consumption, phase shift, slew rate, and most importantly for this application, bandwidth of the amplifier chip.

The power supply terminal 14 of the operational amplifier chip is connected by a lead 16 to a power supply voltage $+V$. The chip also has a non-inverting input, an inverting input, an output, and a set current input and output. The inverting input terminal 18 is connected by a lead 20 to one side of a parallel R-C network comprised of a feedback and bias resistor $R_1$ and a feedback capacitor $C_1$. The other side of the parallel network is connected by a lead 22 to an output terminal 24. Terminal 24 is also connected, by a lead 26, to one side of a feedback capacitor $C_2$, the other side of capacitor $C_2$ being connected by a lead 28 to the non-inverting input terminal 30. The other side of capacitor $C_2$, and, indirectly, terminal 30, provides the synthesized capacitance output 40, designated as $C_{eq}$, via lead 32. Power supply voltage $+V$ is also connected to terminal 30 by a bias resistor $R_2$. A filter capacitor $C_3$ is connected between the power supply and ground.

Separate input set current circuitry is provided by a summer 34, which is connected via a resistor $R_3$ to the input set current terminal 36. The output set current terminal 38 is connected to ground through a resistor $R_4$.

Capacitor $C_2$, which is connected between the chip output terminal 24 and the non-inverting input in a feedback configuration, plays a large part in establishing the synthesized capacitance, $C_{eq}$, at the overall circuit output 40. The amplifier chip output, at terminal 24, is connected to the inverting input terminal 18, through resistor/capacitor network $R_1$, $C_1$, also in a feedback configuration. This configuration constitutes a traditional "follower" for A.C. signals when capacitor $C_1$ is large and $X_{c1}$ is small. Under these conditions, the amplifier chip output at terminal 24 will follow the non-inverting input without inversion.

With the embodiment shown, the power supply voltage, +V, is +12 volts which may be furnished by either a battery or an electronic power supply. This voltage is furnished indirectly to the junction of resistor $R_2$ and capacitor $C_3$ as well as directly to terminal 14. At terminal 14 it powers the operational amplifier chip 12 while at the resistor/capacitor $R_2$, $C_3$ junction, the power supply indirectly functions as a signal input. Capacitor $C_3$ is in shunt with respect to the power supply and functions as a filter, and to function as such, the capacitor must be large, in the order of 1 $\mu f$. Resistor $R_2$, along with resistor $R_1$, sets the bias for the chip as it appears at its terminal 24. Resistor $R_1$ is 560K$\Omega$ and resistor $R_2$ is 1.2M$\Omega$, resulting in an $R_1/R_2$ ratio of about $\frac{1}{2}$. Where the non-inverting input voltage is small, as it is with the LM359 chip, i.e. about 0.6 volt, the voltage at the output terminal 24 will be approximately $(R_1/R_2) \times (+V)$ or about 6 V. The bias level is important because it partially determines both the gain-bandwidth of the amplifier 12 and the D.C. level about which any time-varying signals will swing. The voltage at the inverting input is also about 0.6 volt with a quiescent input current of about 0.2 $\mu a$.

Capacitor $C_1$ is required to be a large, quality capacitor with a value of, for instance, 0.1 $\mu f$. This capacitor functions, as previously noted, to bypass resistor $R_1$ and make the circuit a true follower for time-varying signals. It should be understood that the circuit, by itself, has no time-varying signals. However, it functions as a synthesized capacitance and may be connected to a traditional oscillator to form part of a resonant circuit in place of a conventional capacitor. One possible oscillator circuit in which circuit 10 may be employed is disclosed in U.S. Pat. No. 3,806,831. To be so connected, the ground of the synthesized capacitance may be connected to the ground of the oscillator circuit and the output 40 may be connected to the ungrounded side of the resonant circuit portion of the oscillator circuit to which it is connected. As such, these connections from the synthesized capacitance of the present invention would normally be across a crystal and capacitor or an inductor and capacitor in the oscillator circuit. When so connected, a time-varying signal will be introduced into circuit 10. While a negative resistance also appears at the output 40 along with the synthesized capacitance, it may be neglected because it is large compared to the resistance with which it is normally placed in parallel.

The above-described circuit produces a synthesized capacitance at output 40 whose value is dependent on the value of input set current, $I_{s/i}$. The objective, however, is to provide a circuit design that allows for a programmable (predetermined and variable) capacitance at output 40. A change in the input set current will change the gain-bandwidth of circuit 10 and, in turn, changes the value of capacitance appearing at output 40. For the LM359 chip, the change in gain-bandwidth product per $\mu a$ is expressed as:

$$\text{GBWP}/\mu a = 1.2 \text{ MHz}/\mu a$$

The GBWP may be initially set at:

$$\text{GBWP} = F_G = 25 \text{ MHz}$$

with an input set current, $I_{s/i}$, of about 0.02 ma. The determination of the magnitude of input set current follows. For a circuit connected in a follower configuration, as described herein, the voltage gain may be defined as:

$$K_r = K/(1+K)$$

where
$K_r = (e_o/e_{in})$ ($e_o$ represents the output voltage and $e_{in}$ represents the input voltage) and
K = open loop gain The admittance looking into the non-inverting terminal 30 of amplifier 12 may be expressed as:

$$Y = (1-K_r)J\omega C_2 = J\omega C_2/(1-K)$$

At high frequencies in the range where the invention is intended to operate, 15 MHz to 1 GHz, K may be approximated by $JF_G/F$. With this approximation, the synthesized capacitance, $C_{eq}$, becomes:

$$C_{eq} = C_2/(1+(F_G/F)^2)$$

where F = the operational frequency of circuit 10. It is important to note that $C_{eq}$ is directly proportional to the value of $C_2$.

Although the synthesized capacitance, $C_{eq}$, is a function of the operational frequency F, which is, in turn, affected by the value of the synthesized capacitance itself, the changes in this capacitance are dominated by changes in the GBWP ($F_G$), rather than changes in the operational frequency. The operational frequency is essentially set by the oscillator circuit in which the circuit 10, providing the synthesized capacitance, is placed. The equation for capacitance $C_{eq}$ shows the relationship between capacitor $C_2$ (selected at 1 pf), the gain-bandwidth product controlled by the set current, the operational frequency and the synthesized capacitance appearing at the output 40. While the described circuit is intended to operate from 15 MHz to 1 GHz, it should be understood that the principles of the invention are not so limited. Depending on the operational amplifier chip employed, the circuit may operate from the audio range to the multi-gigahertz range.

The input set current is determined by the output voltage of summer 34 and resistor $R_3$. Typically, the summer will be an operational amplifier in a summer configuration with a plurality of resistor inputs and a resistor as the feedback component. The input signals to the summer 34, as shown, are a temperature compensation voltage, a bias voltage and the output from a digital to analog converter (DAC) (not shown). The temperature compensation voltage is intended to compensate for the diode (voltage) drops in the operational amplifier chip which are temperature dependent but subject to very small changes. Compensation is only important where very small changes in output capacitance, $C_{eq}$, are intended to be controlled, as is the case with circuit 10. It is possible to calculate the internal diode drop variations from formulas disclosed in the operational amplifier chip specifications and to design a compensation network to generate voltages of the same magnitude. However, for very accurate compensation, it has been found that a network must be designed through experimentation to compensate for the internal diode drop variations. Regardless of the intent to control very small changes in output capacitance, such control is only useful where the oscillator in which the invention is to be used is very stable. It should be apparent that, when employed, the temperature compensation voltages will be very small in magnitude.

The DAC input to the summer 34 is generated from a predetermined digital word. That word is the fundamental means used to control variations in capacitance $C_{eq}$ and indirectly control oscillator frequency. The input to the DAC may be direct or, alternatively, may be transmitted, for instance, from a ground station to a satellite. A typical DAC may have a 1024 step count with an analog output that swings from 0 V to +5.0 V and a mid-count (512) output of +2.5 V. Because the circuit 10 requires a positive voltage to establish an input set current, a bias voltage is provided to insure that the summer output voltage does not approach zero as a lower limit or the power supply voltage, +V, as an upper limit. With a bias voltage of, for instance, +8 V, the summer output will swing from +5.5 V to +10.5 V, plus or minus small variations due to the temperature compensation signal. The bias voltage will, in essence, determine the summer output for a mid-count of 512 and determine the center frequency of the oscillator in which circuit 10 is placed. The upper and lower frequency limits of the oscillator may be controlled in 512 discrete steps in either direction. In other words, the input set current, $I_{s/i}$, may be changed in 1024 steps with the GBWP and capacitance, $C_{eq}$, in turn, being changed in 1024 steps.

The GBWP is usually selected by two considerations. One consideration is the value of the synthesized capacitance, $C_{eq}$, assuming a predetermined value of feedback capacitor, $C_2$. The other consideration is the incremental change in the synthesized capacitance due to the change in GBWP. Generally, the incremental change in the magnitude of the synthesized capacitance dominates the choice. The factors that enter into the determination of changes in synthesized capacitance are changes in GBWP with changes in input set current and the corresponding changes in voltages that produce the input set current changes. In circuit 10, the output of summer 34 must provide voltages that produce acceptable input set currents, GBWP's and ranges of acceptable synthesized capacitance for the particular oscillator for which it is intended. While the changes in synthesized capacitance follow a quadradic curve, a crystal oscillator's frequency changes according to a square root function. This results in an oscillator whose frequency changes linearly with changes in the synthesized capacitance over a limited range.

With the summer output having essentially a +8 V mid-level output, and the input set current, $I_{s/i}$, determined from the specifications (from a graph) for the chip 12 at a value of 0.02 ma, and a GBWP corresponding of 25 MHz, the value of resistor $R_3$ may be determined. The specifications also indicate that an internal diode drop, approximately 0.6 V, must be subtracted from the voltage driving resistor $R_3$ to determine the value of $R_3$. The formula given in the specifications is as follows:

$$R_3 = \frac{8 \text{ V (center voltage from summer output)} - 0.6 \text{ V (one diode drop)}}{0.01 \text{ ma (the mid-level input set current for 15 MHz GBWP)}}$$

$$= \frac{7.4 \text{ V}}{0.02 \times 10^{-3} \text{ a}} = 370 \text{K}\Omega$$

The closest standard resistor in magnitude is 390K$\Omega$. Accordingly, the value of resistor $R_3$ employed in circuit 10 is 390K$\Omega$.

The output set current, $I_{s/o}$, establishes the class A bias for and controls the current through a Darlington Pair (not shown) which is internal to chip 12 and comprises the output circuit for the chip. The higher the level of output set current, the lower the output impedance of the Darlington Pair and the greater the load that they can drive. The specifications for chip 12 show that a Darlington Pair output current of 5 ma results in an approximate 5$\Omega$ output impedance which is low enough so that the capacitance, $C_{eq}$, is not substantially affected by loading once circuit 10 is placed into the resonant circuit of an oscillator. The output set current, $I_{s/o}$, is effectively a bias current for the Darlington Pair. Again, from a graph in the specifications for the operational amplifier chip 12, a 0.2 ma output set current will produce a 5 ma output current for the Darlington Pair. To determine the magnitude of resistor $R_4$ required to produce an output set current of 0.2 ma, the specifications give the following formula:

$$R_4 = \frac{12 \text{ V (supply voltage)} - 0.6 \text{ V (one diode drop)}}{I_{s/o}}$$

$$= \frac{11.4 \text{ V}}{0.2 \text{ ma}} \approx 56 \text{K}\Omega$$

When using an OP-32, there is no adjustment for output impedance. Accordingly, there is no terminal available for an $R_4$ connection.

As disclosed, circuit 10 will operate in the following approximate manner:

| Summer Output | $I_{s/i}$ | GBWP | $C_{eq}$ | F |
|---|---|---|---|---|
| 8.0 V | 20 μa | 25 MHz | 0.0385 pf | 5 MHz |
| 5.5 V | 17.5 μa | 17.5 MHz | 0.0490 pf | 5 MHz − 2.5 Hz |
| 10.5 V | 22.5 μa | 32.5 MHz | 0.0309 pf | 5 MHz + 2.5 Hz |

Circuit 10, thus described, will accurately deviate a stable 5 MHz crystal oscillator a total of 5.0 Hz by controlling a 10 bit (1024 step) DAC. The frequency change per step of the DAC is $5 \times 10^{-3}$ Hz. For the case of a 5 MHz oscillator, therefore, each step of the DAC corresponds to 1 part in $10^9$ in terms of frequency. These very small changes in oscillator frequency are achieved by relatively large voltages so that noise is not a primary consideration. In particular, noise at the output of the DAC, at the nanovolt level, will have essentially no effect on the oscillator frequency, F, because each step of the DAC will be about 5 mv (1024 DAC steps divided into the 5 V DAC output range). Circuit 10 is, accordingly, very suitable for satellite communications for the purpose of varying oscillator frequency by very small increments by an easily transmitted serial command word. By choosing suitable scale factors for the oscillator, a 0.5 Hz deviation in oscillator frequency may be controlled in $5 \times 10^{-4}$ steps with each step corresponding to 1 part in $10^{10}$ in terms of frequency.

I claim:
1. A variable electronic capacitance comprising:
   a programmable operational amplifier with inverting and non-inverting inputs, an output, and an input for input set current;

a low impedance network connected between said output and said inverting input in a follower configuration;

a capacitance connected between said output and said non-inverting input; and means to vary said input set current.

2. The electronic capacitance of claim 1 wherein said low impedance network is a parallel resistance/capacitance network where the capacitance forms a low impedance at a predetermined operational frequency.

3. The electronic capacitance of claim 1 wherein said capacitance connected between said output and said non-inverting input is a lumped constant capacitor.

4. The electronic capacitance of claim 1 wherein said means to vary input set current includes a resistor connected at one end to said input for input set current and connected at the other end to a variable voltage source.

5. The electronic capacitance of claim 1 wherein said variable voltage source is a summer driven by a digital to analog converter.

6. The electronic capacitance of claim 5 wherein a bias voltage also drives said summer.

7. The electronic capacitance of claim 6 wherein a temperature compensation voltage also drives said summer.

8. The electronic capacitance of claim 1 wherein a resistor is connected at one end to said non-inverting input and at the other end to supply voltage.

9. The electronic capacitance of claim 1 wherein said non-inverting input provides a variable capacitance means.

10. The electronic capacitance of claim 9 wherein said non-inverting input is connectable to an oscillator circuit.

11. The electronic capacitance of claim 10 wherein said non-inverting input is connectable to a tuned portion of said oscillator circuit.

12. The electronic capacitance of claim 1 wherein said programmable operational amplifier also includes a terminal for output set current which is connected to a means to limit said output set current.

13. The electronic capacitance of claim 12 wherein said means to limit output set current is a resistor.

14. A variable electronic capacitance comprising:

a programmable operational amplifier having inverting and non-inverting input terminals, an output terminal, an input program terminal for accepting input set current, and a power supply terminal;

circuit means for connecting said power supply terminal to a direct current voltage;

circuit means for interconnecting said output terminal to said inverting input terminal and placing said operational amplifier into a follower configuration;

capacitance means for connecting said output terminal and said non-inverting input terminal and providing a feedback signal to said non-inverting input terminal;

said direct current voltage source also being indirectly connected to said non-inverting terminal to provide a signal thereto; and variable voltage means connected to said input program terminal for varying said input set current.

15. The variable electronic capacitance of claim 14 wherein said circuit means is a parallel resistance/capacitance network which is low impedance at the operational frequency of said variable electronic capacitance.

16. The variable electronic capacitance of claim 14 wherein said non-inverting input terminal is connectable to an oscillator circuit.

17. The variable electronic capacitance of claim 16 wherein said non-inverting input terminal is connectable to a tuned portion of said oscillator circuit.

18. The variable electronic capacitance of claim 14 wherein said variable voltage means includes a digital to analog converter.

19. The variable electronic capacitance of claim 14 wherein said capacitance means is a capacitor directly connected between said output terminal and said non-inverting input terminal.

* * * * *